United States Patent
Lendenmann et al.

(10) Patent No.: US 10,879,150 B2
(45) Date of Patent: Dec. 29, 2020

(54) ARRANGEMENT FOR SUBSEA COOLING OF SEMICONDUCTOR MODULES

(71) Applicant: ABB Schweiz AG, Baden (CH)

(72) Inventors: Heinz Lendenmann, Västerås (SE); Thomas Gradinger, Aarau Rohr (CH); Thomas Wagner, Mägenwil (CH); Timo Koivuluoma, Vantaa (FI); Tor Laneryd, Enköping (SE)

(73) Assignee: ABB Schweiz AG, Baden (CH)

( * ) Notice: Subject to any disclaimer, the term of this patent is extended or adjusted under 35 U.S.C. 154(b) by 447 days.

(21) Appl. No.: 15/409,089

(22) Filed: Jan. 18, 2017

(65) Prior Publication Data

US 2017/0243805 A1    Aug. 24, 2017

(30) Foreign Application Priority Data

Feb. 23, 2016 (EP) .................................. 16156804

(51) Int. Cl.
*H01L 23/44* (2006.01)
*H05K 7/20* (2006.01)
(Continued)

(52) U.S. Cl.
CPC .............. *H01L 23/44* (2013.01); *H01L 21/52* (2013.01); *H01L 21/54* (2013.01);
(Continued)

(58) Field of Classification Search
None
See application file for complete search history.

(56) References Cited

U.S. PATENT DOCUMENTS

| 4,167,771 A | 9/1979 | Simons |
| 8,537,554 B1 * | 9/2013 | Hockaday ........... H01L 31/0521 136/246 |

(Continued)

FOREIGN PATENT DOCUMENTS

| EP | 2487327 A1 | 8/2012 |
| EP | 2900046 A1 | 7/2015 |

OTHER PUBLICATIONS

Definitio of 'Taper' downloaded from URL<https://www.merriam-webster.com/dictionary/taper> on Dec. 12, 2018. (Year: 2018).*

(Continued)

*Primary Examiner* — J. E. Schoenholtz
(74) *Attorney, Agent, or Firm* — Whitmyer IP Group LLC

(57) ABSTRACT

An arrangement for subsea cooling of a semiconductor module. The arrangement includes a tank. The tank is filled with a dielectric fluid. The arrangement includes at least one semiconductor module. The at least one semiconductor module is placed in the tank. Each at least one semiconductor module includes semiconductor submodules and is attached to a heat sink. The semiconductor submodules generate heat, thereby causing the dielectric fluid to circulate by natural convection. The heat sink includes a first part having a first thermal resistance from the semiconductor module to the dielectric fluid. The heat sink includes a second part having a second thermal resistance from the semiconductor module to the dielectric fluid. The second thermal resistance is higher than the first thermal resistance. The heat sink is oriented such that, when the arrangement is installed, the first part is configured to lie vertically higher than the second part.

15 Claims, 2 Drawing Sheets

(51) Int. Cl.
    *H01L 21/52* (2006.01)
    *H01L 21/54* (2006.01)
    *H01L 23/367* (2006.01)
    *H01L 25/07* (2006.01)
    *H01L 25/18* (2006.01)
    *H01L 25/00* (2006.01)
    *H02B 1/56* (2006.01)
    *H01L 25/075* (2006.01)
    *H01L 33/64* (2010.01)
    *H01L 23/373* (2006.01)

(52) U.S. Cl.
    CPC ........ *H01L 23/3672* (2013.01); *H01L 25/072* (2013.01); *H01L 25/18* (2013.01); *H01L 25/50* (2013.01); *H02B 1/565* (2013.01); *H05K 7/20236* (2013.01); *H05K 7/20927* (2013.01); *H01L 23/3736* (2013.01); *H01L 25/0753* (2013.01); *H01L 33/642* (2013.01)

(56) References Cited

U.S. PATENT DOCUMENTS

| | | | |
|---|---|---|---|
| 9,414,525 B2* | 8/2016 | Campbell | H05K 7/2039 |
| 2002/0112846 A1* | 8/2002 | Noda | F28F 3/02 |
| | | | 165/80.3 |
| 2009/0145581 A1* | 6/2009 | Hoffman | F28F 1/40 |
| | | | 165/80.3 |
| 2010/0078675 A1* | 4/2010 | Kudo | H01L 23/24 |
| | | | 257/140 |
| 2011/0214904 A1* | 9/2011 | Ohsawa | H01L 23/3677 |
| | | | 174/252 |
| 2015/0022975 A1* | 1/2015 | Browne | H01L 23/4012 |
| | | | 361/700 |

OTHER PUBLICATIONS

European Search Report Application No. EP 16 15 6804 Completed: Aug. 18, 2016; dated Aug. 30, 2016 7 pages.

* cited by examiner

ARRANGEMENT FOR SUBSEA COOLING OF SEMICONDUCTOR MODULES

TECHNICAL FIELD

The invention relates to cooling arrangements, and particularly to arrangements for subsea cooling of semiconductor modules.

BACKGROUND

In general terms, electric subsea installations and devices usually demand high standards regarding durability, long-term functionality and independence during operation. Electric subsea installations that need to be cooled during operation, such as subsea converters, require an autonomous and durable cooling of its components. It is known to use a dielectric fluid (also known as liquid dielectric) such as a for example oil as a cooling fluid. In general, electric subsea installations need to be pressurized with the dielectric fluid, thus said fluid, which is preferably a liquid, should be, at least almost, incompressible. In general terms, the dielectric fluid thus is used to provide an incompressible medium and additionally as an electric insulation medium of components, such as power electronics building blocks (PEBBs), placed in the electric installation.

The oil may thus be used both for the cooling of the electric and electronic components of the subsea converter, and for the electric insulation. Because of the high reliability required, the subsea converter cooling system may be passive, i.e., without the need for a pump to achieve the cooling. The oil in the converter tank (and in any oil-to-sea-wader heat exchanger) may thus be moved by natural convection only. Also the sea water cooling the oil-to-sea-water heat exchanger may be moved by natural convection only. Consequently, the cooling efficiency is limited, and the design of an economical cooling system may be challenging.

Hence there is still a need for improved mechanisms for subsea cooling of electronic components.

SUMMARY

An object of embodiments herein is to provide efficient mechanisms for subsea cooling of electronic components.

According to a first aspect there is presented an arrangement for subsea cooling of a semiconductor module. The arrangement comprises a tank. The tank is filled with a dielectric fluid. The arrangement comprises at least one semiconductor module. The at least one semiconductor module is placed in the tank. Each at least one semiconductor module comprises semiconductor submodules and is attached to a heat sink. The semiconductor submodules generate heat, thereby causing the dielectric fluid to circulate by natural convection. The heat sink comprises a first part having a first thermal resistance from the semiconductor module to the dielectric fluid. The heat sink comprises a second part having a second thermal resistance from the semiconductor module to the dielectric fluid. The second thermal resistance is higher than the first thermal resistance. The heat sink is oriented such that the first part is configured to lie vertically higher than the second part.

Advantageously, this provides efficient subsea cooling of the semiconductor module.

According to a second aspect there is presented a method for providing an arrangement for subsea cooling of a semiconductor module. The arrangement is provided by providing a tank and filling the tank with a dielectric fluid; and placing at least one semiconductor module in the tank. Each at least one semiconductor module comprises semiconductor submodules and is attached to a heat sink. The semiconductor submodules generate heat, thereby causing the dielectric fluid to circulate by natural convection. The heat sink comprises a first part having a first thermal resistance from the semiconductor module to the dielectric fluid. The heat sink comprises a second part having a second thermal resistance from the semiconductor module to the dielectric fluid. The second thermal resistance is higher than the first thermal resistance. The heat sink is oriented such that the first part is configured to lie vertically higher than the second part.

It is to be noted that any feature of the first and second aspects may be applied to any other aspect, wherever appropriate. Likewise, any advantage of the first aspect may equally apply to the second aspect, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Power electronic equipment such as power converters, variable speed drives, or high voltage direct current (HVDC) valves can advantageously be submerged in a tank filled with a dielectric fluid (such as mineral oil, natural esters, etc.) which acts as electric insulation and cooling medium. The benefit is particularly large for power electronic equipment installed subsea, because the dielectric fluid can be used with a pressure compensation system to achieve an internal pressure close or equal to the external pressure.

Figure 1:
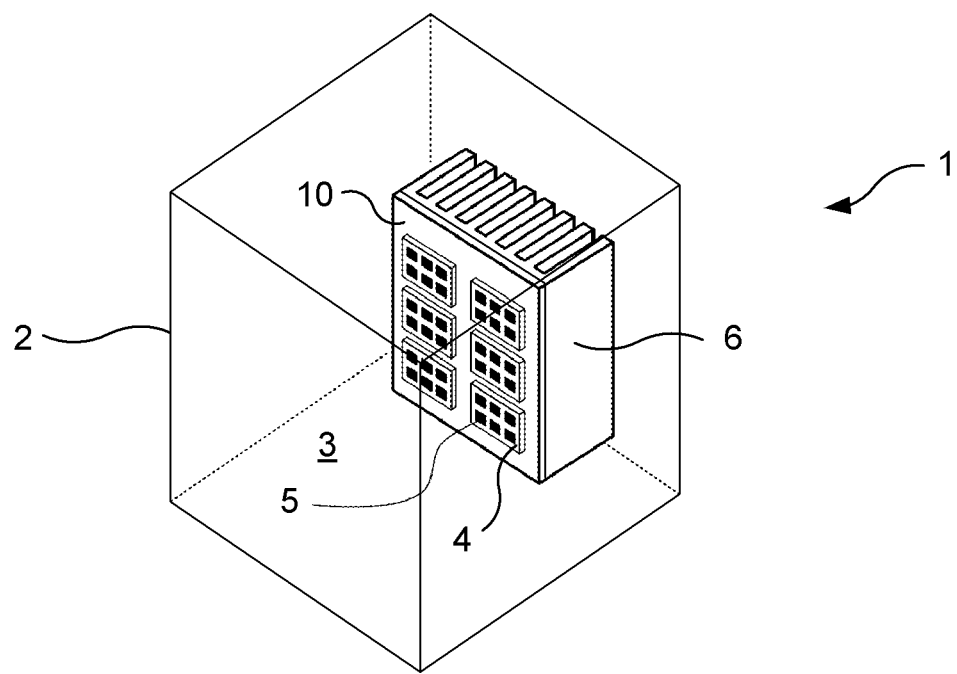
FIG. 1 schematically illustrates an arrangement for subsea cooling of a semiconductor module according to state of the art.

FIG. 1 schematically illustrates a traditional arrangement 1 for subsea cooling of a semiconductor module 4 according to state of the art. The arrangement comprises a tank 2. The tank 2 is filled with a dielectric fluid 3. The arrangement 1 further comprises semiconductor modules 10. The semiconductor modules in are placed in the tank 2. The semiconductor modules in are thus submerged in the tank 2 filled with dielectric fluid 3.

The semiconductor modules 10 may include a number of semiconductor submodules 4. The semiconductor submodules 4 may include a number of semiconductor elements 5, also denoted chips. Each semiconductor module 10 may comprise a plurality of semiconductor submodules 4, and each semiconductor submodule 4 may comprise a plurality of semiconductor elements 5. In the example of FIG. 1, the semiconductor module 10 comprises six semiconductor submodules 4 and each semiconductor submodule 4 comprises six semiconductor elements 5.

To ensure reliability, the temperature of the semiconductor elements 5 should be below a certain limit and evenly distributed across the semiconductor modules 10. The heat flux density of a semiconductor module 10 is typically so high that its surface is insufficient to transfer the heat to the dielectric liquid 3. To increase the surface, the semiconductor module 10 is attached to a heat sink 6 made from a highly conductive material, such as aluminum or copper.

The heat sink 6 may have a number of cooling fins or cooling pins around which the dielectric fluid 3 can flow. The suitable length of the cooling fins depends on the material properties of the fin material, the material properties of the dielectric fluid 3, and the heat losses that are being generated in the semiconductor modules 10 and transferred to the heat sink.

Due to the low flow velocity of the dielectric fluid 3 when cooling of the semiconductor module 10 is based on natural convection, the temperature of the dielectric fluid 3 will increase considerably as the dielectric fluid 3 traverses the heat sink 6. The temperature of each semiconductor submodule 4 depends on the thermal resistance to the local fluid temperature. For this reason, with a conventional heat sink arrangement, such as in the arrangement 1 of FIG. 1, the temperature of semiconductor submodule 4 at a higher vertical height will be considerably higher than that of semiconductor submodules 4 at a lower vertical height.

According to the embodiments presented herein, the thermal performance of the heat sink 6 is designed so that the thermal resistance from the semiconductor module 10 to local dielectric fluid 3 is increased in the lower part of the heat sink 6. This will increase the temperature for the semiconductor submodules 4 in the lower part of the heat sink 6, whilst only marginally increasing the temperature of the semiconductor submodules 4 of the upper part of the heat sink 6. In this way the temperature distribution across all semiconductor submodules 4 and semiconductor elements 5 is more even and the reliability is improved. Embodiments of two such arrangements 11*a*, 11*b* are shown in FIG. 2 and FIG. 3, respectively.

Figure 2:
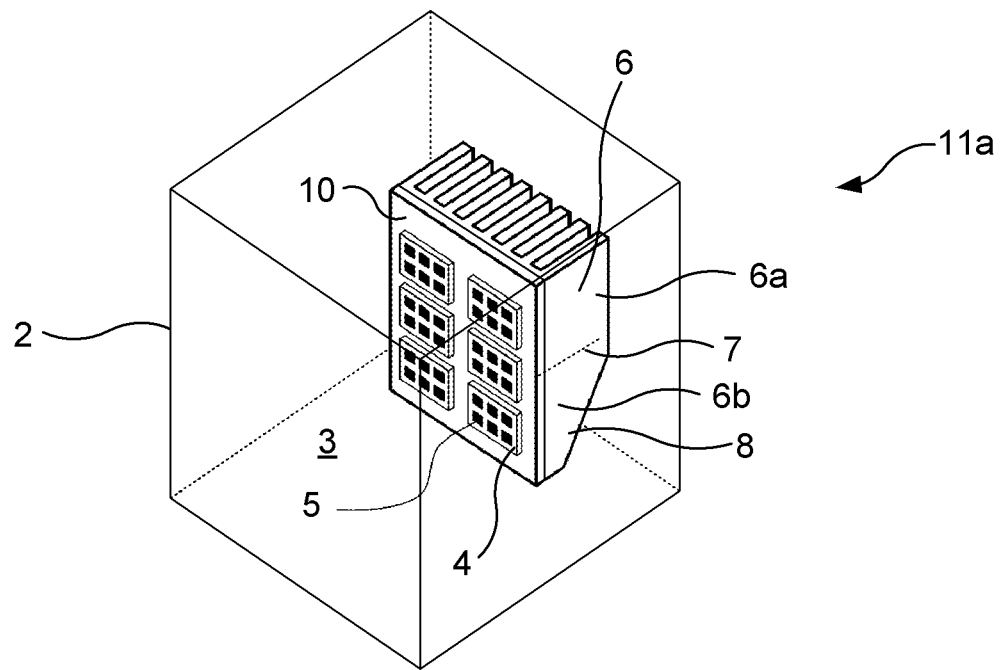
FIGS. 2-3 schematically illustrate arrangements for subsea cooling of a semiconductor module according to embodiments.
Figure 3:
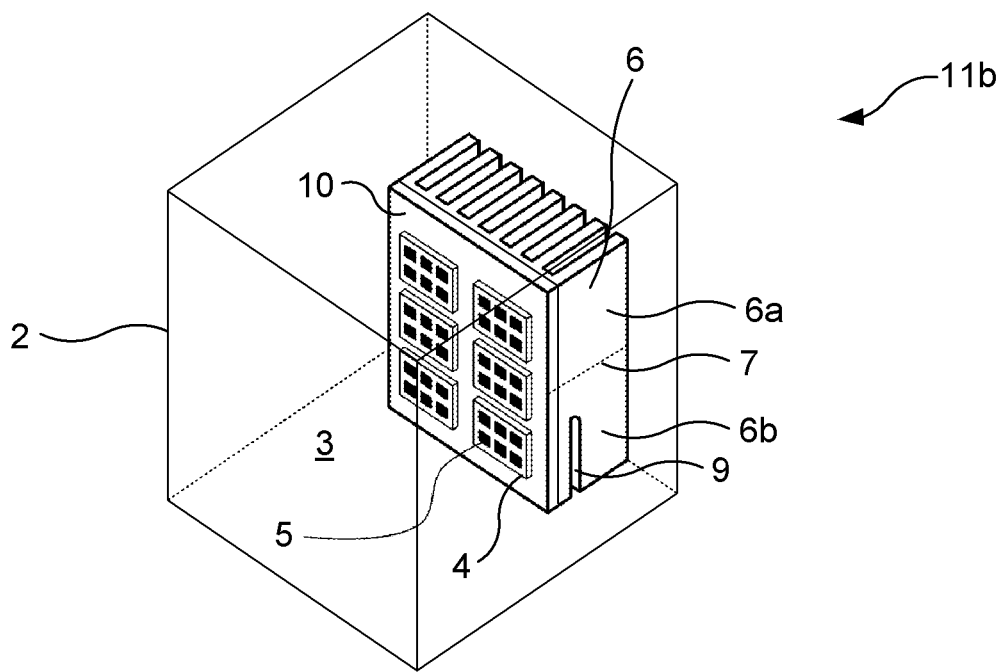

Parallel reference are now made to FIGS. 2 and 3 schematically illustrating arrangements 11*a*, 11*b* for subsea cooling of a semiconductor module 10.

Each arrangement 11*a*, 11*b* comprises a tank 2. The tank 2 is filled with a dielectric fluid 3.

Each arrangement 11*a*, 11*b* further comprises a semiconductor module 10. The semiconductor module 10 is placed in the tank 2. The semiconductor module 10 is thus submerged in the tank 2 filled with dielectric fluid 3. The semiconductor module 10 comprises semiconductor submodules 4. Each semiconductor submodule 4 comprises semiconductor elements 5. A power electronic device may comprise a plurality of such semiconductor modules 10 and each semiconductor module 10 may comprise a plurality of semiconductor submodules 4 and each semiconductor submodule 4 may comprises a plurality of semiconductor elements 5.

The semiconductor module 10, in use, generates heat, thereby causing the dielectric fluid 3 to circulate by natural convection. The semiconductor module 10 is therefore attached to a heat sink 6.

The heat sink 6 comprises a first part 6*a* and a second part 6*b*. In FIGS. 2 and 3 the upper part 6*a* and the lower part 6*b* are divided from each other by an imagined horizontal line 7. The first part 6*a* of the heat sink 6 has a first thermal resistance from the semiconductor elements 5 to the dielectric fluid 3. The second part 6*b* has a second thermal resistance from the semiconductor elements 5 to the dielectric fluid 3. The second thermal resistance is higher than the first thermal resistance. The heat sink 6 is oriented such that, when the arrangement 11*a*, 11*b* is correctly installed (for example at a seabed), the first part 6*a* is vertically higher than the second part 6*b*. A correct installation orientation of the arrangement 11*a*, 11*b* may be marked on the same, or it can otherwise be obvious e.g. from the design of the same. As disclosed above, this enables the temperature distribution across all semiconductor submodules 4 to be more even and thereby improving the reliability of the arrangements 11*a*, 11*b* in comparison to the arrangement 1.

Particular embodiments for a heat sink 6 where the second thermal resistance is higher than the first thermal resistance will now be disclosed.

According to some embodiments the heat sink 6 is has a shape such that second thermal resistance is higher than the first thermal resistance. According to the embodiment of FIG. 2, the second part 6*b* comprises a tapered portion 8. Hence, in this respect the heat sink 6 is thicker at the first part 6*a* than at the second part 6*b*. One way to obtain such a heat sink is to chamfer the second part 6*b* of a cuboid shaped heat sink 6 so to provide the second part 6*b* with a tapered portion 8. According to the embodiment of FIG. 3, the second part 6*b* comprises a recess 9. Providing the second part 6*b* with such a recess 9 reduces the surface of the second part 6*b*. According to a further embodiment, the material used in the first part 6*a* is not the same as the material used in the second part 6*b*; either the material is gradually changing from the first part 6*a* to the second part 6*b* or the first part 6*a* and the second part 6*b* are made of two distinct materials and bonded together. Particularly, according to this further embodiment the second part 6*b* has lower heat conductivity than the first part 6*a*.

According to some embodiments the heat sink 6 comprises fins. Particular embodiments for a heat sink 6 comprising fins and where the second thermal resistance is higher than the first thermal resistance will now be disclosed. For example, higher thermal resistance can be achieved by having shorter fins. In this respect the fins could be shorter in any direction in which they extend. Hence, according to an embodiment the fins of the second part 6*b* are shorter than the fins of the first part 6*a*. There are different ways of making the fins of the second part 6*b* to be shorter than the fins of the first part 6*a*. For example, the fins can be made gradually shorter. Hence, in some aspects the fins are gradually shorter along a direction from the first part 6*a* to the second part 6*b*. This is illustrated in the arrangement 10*a* of FIG. 2. For example the fins can be made stepwise shorter. Hence, in some aspects the fins are stepwise shorter along a direction from the first part 6*a* to the second part 6*b*. For example the higher thermal resistance can be achieved by lowered number of fins per area unit. Hence, in some aspects the second part 6b has lower number of fins per area unit than the first part 6a. In other words, the second part 6b can comprise fewer fins than the first part 6a. For example, every other fin, or every third fin, could be omitted in the second part 6b.

As the skilled person understands, any of the above disclosed embodiments for a heat sink 6 (with or without fins) where the second thermal resistance is higher than the first thermal resistance can be readily combined. For example, the arrangement ma of FIG. 2 comprises a heat sink 6 having tapered fins (i.e., where the heat sink 6 comprises fins and where the second part 6b is tapered, thus resulting in gradually shorter fins in the second part 6b than in the first part 6a).

In the illustrations of FIGS. 2 and 3 each arrangement 11a, 11b comprises one semiconductor module 10 comprising six semiconductor submodules 4. Generally, any of the arrangements 11a, 11b can comprise a plurality of semiconductor modules 10, each comprising a plurality of semiconductor submodules 4, where all semiconductor modules 10 are attached to one and the same heat sink 6. Alternatively, each semiconductor modules 10 is attached one of at least two heat sinks 6.

There are different kinds of semiconductor elements 5 that can be part of the semiconductor submodules 4. For example, the semiconductor elements 5 can comprise diodes and insulated-gate bipolar transistors (IGBTs). There are different ways of placing the diodes and the IGBTs in a semiconductor element 5. For example, the diodes may be placed above the IGBTs. Hence, according to an embodiment the semiconductor elements 5 are arranged such that, when the arrangement 11a, 11b is installed, the diodes are positioned vertically higher than the IGBTs in the at least one semiconductor submodule 4. Advantageously the diodes are designed to have lower losses than the IGBTs, so that the temperature rise over local fluid temperature is lower. Since the dielectric fluid 3 is heating up while moving upwards, the diodes and IGBTs will have a more evenly distributed temperature if the diodes are positioned vertically higher than the IGBTs in each semiconductor submodule 4. Alternatively, all semiconductor elements 5 comprises either diodes or IGBTs.

Figure 4:
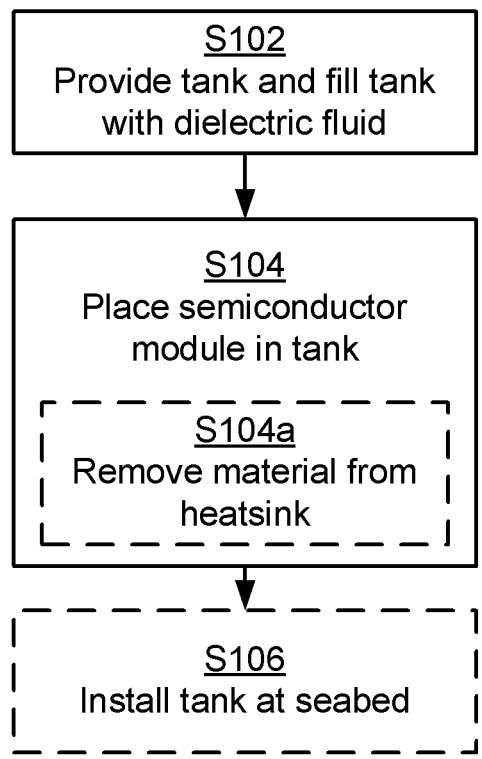
FIG. 4 is a flow chart illustrating a method according to embodiments.

Reference is now made to FIG. 4 illustrating methods for providing an arrangement 11a, 11b for subsea cooling of a semiconductor module 4. The arrangement 11a, 11b is provided by steps S102 and S104 being performed:

S102: A tank 2 is provided and filled with a dielectric fluid 3.

S104: At least one semiconductor module 10 is placed in the tank 2. As disclosed above, each at least one semiconductor module 10 is attached to a heat sink 6 and comprises semiconductor submodules 4 which in turn comprise semiconductor elements 5. The at least one semiconductor submodule 4 is configured to, in use, generate heat, thereby causing the dielectric fluid 3 to circulate by natural convection.

As disclosed above, the heat sink 6 comprises a first part 6a and a second part 6b. The first part 6a of the heat sink 6 has a first thermal resistance from the semiconductor elements 5 to the dielectric fluid 3. The second part 6b has a second thermal resistance from the semiconductor elements 5 to the dielectric fluid 3. The second thermal resistance is higher than the first thermal resistance.

The arrangement 11a, 11b is provided in steps S102 and S104 such that the heat sink 6 is oriented so that, when the arrangement 11a, 11b is correctly installed, the first part 6a is vertically higher than the second part 6b.

As disclosed above, one way to obtain a heat sink 6 where the second thermal resistance is higher than the first thermal resistance is to chamfer the second part 6b of a cuboid shaped heat sink 6 so to provide the second part 6b with a tapered portion 8 or to provide the second part 6b with a recess 9. Hence, according to an embodiment material is therefore cut from the heat sink 6 to achieve a higher thermal resistance in the lower part 6b. Hence, according to an optional step S104a, material is removed from the second part 6b so as to give the second part 6b higher thermal resistance than the first part 6a. Optional step S104a is performed as part of step S104.

According to an optional step S106, the tank 2 of the arrangement 11a, 11b is installed on a seabed. Preferably, steps S102 and S104 (and optional step S104a) are performed prior to step S106.

The invention has mainly been described above with reference to a few embodiments. However, as is readily appreciated by a person skilled in the art, other embodiments than the ones disclosed above are equally possible within the scope of the invention, as defined by the appended patent claims. Further, as the skilled person understands, any feature associated with the herein disclosed arrangements 11a, 11b for subsea cooling of a semiconductor module 4 may also be associated with the herein disclosed method for providing an arrangement 11a, 11b for subsea cooling of a semiconductor module 10. For example, the herein disclosed arrangements 11a, 11b are advantageously used for medium voltage drives with a modular multilevel converter (MMC) medium voltage drive topology or a cascade H-bridge (CHB) medium voltage drive topology but are not considered limited to these topologies or this application.

The invention claimed is:

1. An arrangement for subsea cooling of a semiconductor module, the arrangement comprising:
    a tank, the tank being filled with a dielectric fluid; and
    at least one semiconductor module placed in the tank, each of the at least one semiconductor module comprising semiconductor submodules and being attached to a heat sink,
    wherein the semiconductor submodules generate heat, thereby causing the dielectric fluid to circulate by natural convection,
    wherein the heat sink comprises a first part having a first thermal resistance from the semiconductor module to the dielectric fluid, and a second part having a second thermal resistance from the semiconductor module to the dielectric fluid,
    wherein the second thermal resistance is higher than the first thermal resistance, and
    wherein the first part is configured to lie vertically higher than the second part.

2. The arrangement according to claim 1, wherein the second part comprises a tapered portion.

3. The arrangement according to claim 1, wherein the second part comprises a recess.

4. The arrangement according to claim 1, wherein the second part has lower thermal conductivity than the first part.

5. The arrangement according to claim 1, wherein the heat sink comprises fins, and wherein the fins of the second part are shorter than the fins of the first part.

6. The arrangement according to claim 5, wherein the fins taper along a direction from the first part to the second part.

7. The arrangement according to claim 5, wherein the fins are stepwise shorter along a direction from the first part to the second part.

8. The arrangement according to claim 5, wherein the second part has lower number of fins per area unit than the first part.

9. The arrangement according to claim 1, wherein the arrangement comprises a plurality of semiconductor modules, all of which are attached to said heat sink.

10. The arrangement according to claim 1, wherein the semiconductor submodules comprise semiconductor elements, and wherein each semiconductor element comprises diodes and insulated-gate bipolar transistors, IGBTs.

11. The arrangement according to claim 10, wherein the diodes are configured to positioned vertically higher than the IGBTs in the semiconductor submodules.

12. A method for providing an arrangement for subsea cooling of a semiconductor module, the method comprising:
providing a tank, and filling the tank with a dielectric fluid; and
placing at least one semiconductor module in the tank, each of the at least one semiconductor module comprising semiconductor submodules and being attached to a heat sink,
wherein the semiconductor submodules generate heat, thereby causing the dielectric fluid to circulate by natural convection,
wherein the heat sink comprises a first part having a first thermal resistance from the semiconductor module to the dielectric fluid, and a second part having a second thermal resistance from the semiconductor module to the dielectric fluid,
wherein the second thermal resistance is higher than the first thermal resistance, and
wherein the first part is configured to lie vertically higher than the second part.

13. The method according to claim 12, further comprising:
removing material from the second part so as to provide the second part higher thermal resistance than the first part.

14. The method according to claim 12, further comprising:
installing the tank of the arrangement at a seabed.

15. An arrangement for subsea cooling of a semiconductor module, the arrangement comprising:
a tank filled with a dielectric fluid;
a semiconductor module placed in the tank, the semiconductor module comprising semiconductor submodules; and
at least one heat sink attached to the semiconductor submodules;
wherein the semiconductor submodules generate heat;
wherein the heat sink comprises a first part located vertically higher than a second part;
wherein the second part has a higher thermal resistance than the first part.

* * * * *